(12) United States Patent
Doi

(10) Patent No.: US 6,889,422 B2
(45) Date of Patent: May 10, 2005

(54) METHOD OF ASSEMBLING MAGNETIC CIRCUITRY FOR USE IN MRI SYSTEM

(75) Inventor: Yuhito Doi, Takefu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 448 days.

(21) Appl. No.: 09/987,668

(22) Filed: Nov. 15, 2001

(65) Prior Publication Data

US 2002/0056187 A1 May 16, 2002

(30) Foreign Application Priority Data

Nov. 16, 2000 (JP) ........................................ 2000-350180

(51) Int. Cl.⁷ ............................................... H01F 7/06
(52) U.S. Cl. .......................... 29/602.1; 29/606; 29/607; 310/110
(58) Field of Search ............................ 29/602.1, 606, 29/607; 336/110

(56) References Cited

U.S. PATENT DOCUMENTS

| 4,947,042 A | * | 8/1990 | Nishioka et al. | ............ 250/306 |
| 5,384,538 A | * | 1/1995 | Ohta et al. | ................... 324/319 |
| 5,431,165 A | * | 7/1995 | Sellers | ........................ 600/422 |
| 6,336,989 B1 | * | 1/2002 | Aoki et al. | .............. 156/275.7 |
| 6,340,888 B1 | * | 1/2002 | Aoki et al. | ................. 324/319 |

FOREIGN PATENT DOCUMENTS

| EP | 0 978 727 A2 | 2/2000 | |
| JP | 62-196803 A | 8/1987 | |
| JP | 63-107006 A | 5/1988 | |
| JP | 06251930 A | * 9/1994 | ............. H01F/7/02 |
| JP | 08-339916 A | 12/1996 | |
| JP | 2000-51175 A | 2/2000 | |
| JP | 2000-51175 | 2/2000 | |

OTHER PUBLICATIONS

"The design and construction of high field–uniformity permanent magnet system for MRI"; Feng, Z.X.; Jiang, X.H.; Han, S.; Magnetics, IEEE Transactions on, vol.: 28, Issue: 1, Jan 1992; pp.: 641–643.*

* cited by examiner

Primary Examiner—A. Dexter Tugbang
Assistant Examiner—Paul D Kim
(74) Attorney, Agent, or Firm—Sughrue Mion, PLLC

(57) ABSTRACT

Assembling magnetic circuitry for an MRI system is disclosed. The MRI system comprises two permanent magnets provided within a yoke structure such as to face each other for generating magnetic field in the space defined therebetween, and two pole pieces respectively provided on opposing surfaces of the permanent magnets. Each of the pole pieces is installed at a predetermined position of the corresponding permanent magnet by sliding the pole piece on the corresponding permanent magnet in a direction parallel with a main surface of the corresponding permanent magnet on which the pole pieces is to be installed.

4 Claims, 5 Drawing Sheets

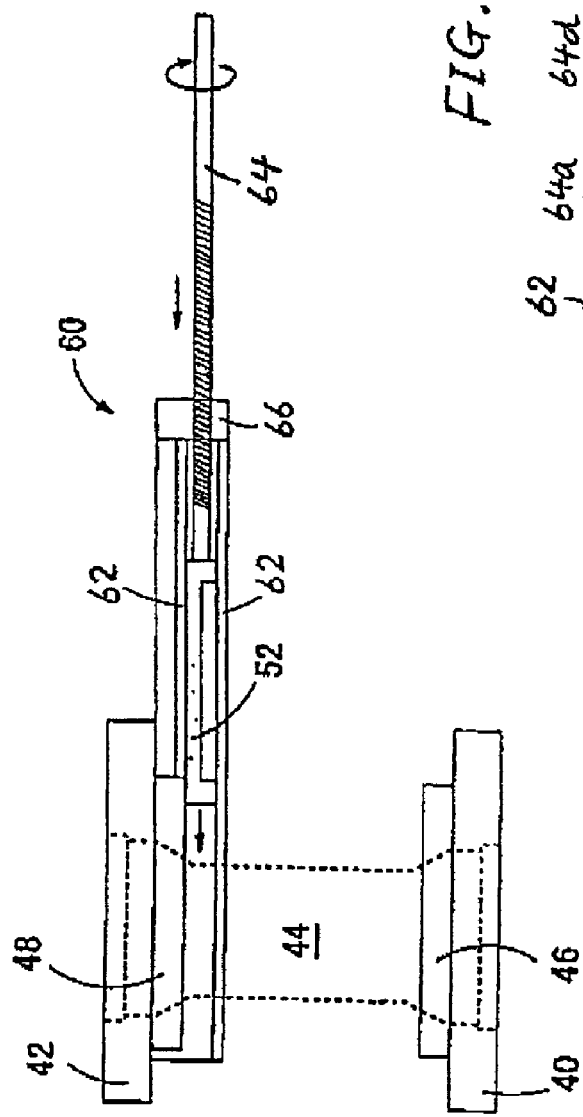
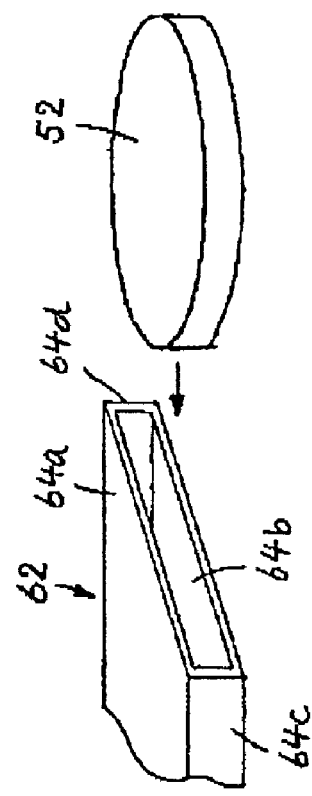
FIG. 4
FIG. 5

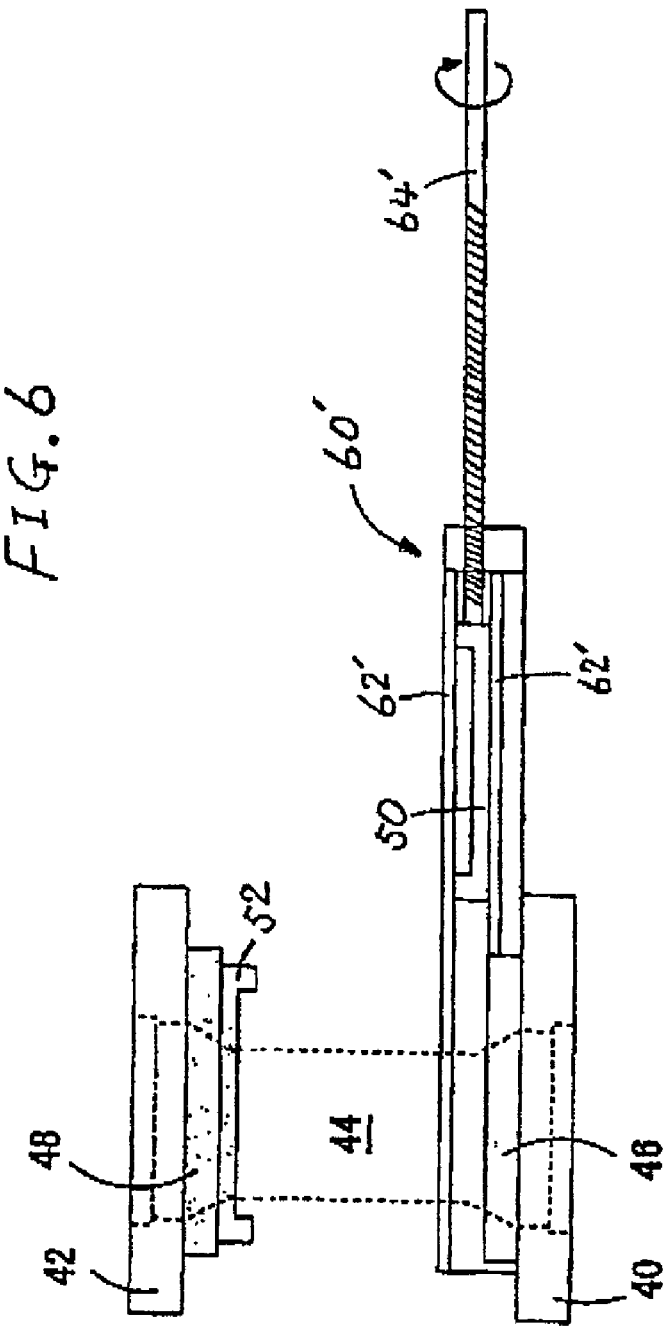

METHOD OF ASSEMBLING MAGNETIC CIRCUITRY FOR USE IN MRI SYSTEM

BACKGROUND OF THE INVENTION

1. Field of the Invention

The present invention relates generally to technology for assembling magnetic circuitry for use In a magnetic resonance imaging (MRI) system, and more specifically to a method of installing pole pieces at predetermined positions of permanent magnets.

2. Description of Related Art

Magnetic resonance imaging (MRI) is an imaging technique used primarily in medical settings or diagnoses to produce high quality images of the inside of the human body. MRI is based on the principles of nuclear magnetic resonance, a spectroscopic technique to obtain microscopic chemical and physical information about molecules, As is known in the art, resistive electromagnets, permanent magnets, and super-conducting electromagnets have been used in the magnet field generators of MRI systems. The resistive electromagnets consist of many winding or coils of wire wrapped around a cylinder or bore through which an electric current is passed. Among these magnets, the super-conducting electromagnets are by far the most commonly used.

However, with the improvement of characteristics of permanent magnets using rare-earth elements, it is a current practice to use the permanent magnets in the MRI systems wherein the magnetic field strength is less than 0.5-Tesla (for example). Hereinafter, the permanent magnets made of rare-earth elements are referred to as magnets or permanent magnets.

In the MRI system using the permanent magnets, two magnets typically disk-shaped are installed in the system such as to face each other within a yoke structure. The two magnets respectively carry pole pieces on the major surfaces thereof (viz., at the predetermined positions of the magnets) such as to face each other in order to generate a uniform magnetic field in the space between the two magnets.

Each of the disk-shaped magnets, used in the MRI system, has usually a diameter of about 1(one) meter. Since it is practically impossible to fabricate the magnet with such a large diameter as a single unit, the magnet is manufactured by bringing together a plurality of magnetized blocks to assemble the permanent magnet Each magnetic block is fabricated by compressing magnetic power into a cube (for example) with each side ranging 4 to 10 cm, and thereafter sintering the cube and magnetizing the same. Such blocks, once magnetized, have extremely strong magnetic strengths, and the attracting force between the two magnets or between each magnet and a plate yoke on which the permanent magnets are assemble, reaches as strong as approximately 0.5-ton. Accordingly, in order to bring together the magnet blocks to form the disk-shaped magnets on the plain yoke, it is inevitable to prepare very stout and rigid assembling tools or structures. However, the manner of assembling the disk-shaped magnet using the blocks on the plate yoke is not directly concerned with the present invention, and accordingly, the description thereof will be omitted for the sake of simplifying the instant disclosure.

Before turning to the present invention, it is deemed preferable to briefly describe, with reference to FIGS. 1 and 2, the prior art relevant to the present invention, which is disclosed in the Japanese Laid-open Patent Application No. 2000-51175.

FIG. 1 is a diagram schematically showing a magnetic field generator 8 for use in an MRI system. As shown, the generator 8 comprises a pair of substantially rectangular plate yokes 10 and 12, which are rigidly coupled to four cylindrical column yokes 14a–14d, forming magnetic circuits or magnetic flux paths therewith. A disk-shaped magnet 18 is formed using a plurality of magnetic blocks 16, and being provided on the upper surface of the plate yoke 10, and carrying thereon a disk-like polo piece 19 which has a protrusion along the circumference thereof. As shown in FIG. 2, a magnet 17 is provided on the inner surface of the plate yoke 12 which carries a pole piece 21 which corresponds to the pole piece 19.

The magnetic field generator 8 shown in FIG. 1 is assembled as follows. Although not shown in the drawings, a plurality of magnetized blocks 16 are brought together to form the magnet 18 on the major surface of the plate yoke 10. Thereafter, the pole piece 19 is positioned on the magnet 18 against extremely strong magnetic forces therebetween. In more specific terms, when the pole piece 19 is brought into in the vicinity of the magnet 16, the magnetic attracting force reaches approximately 10-ton. Therefore, according to the prior art, the pole piece 19 is very slowly lowered using a crane with extreme care and attention. It is understood that such a crane should be very strong so as to resist the above-mentioned attracting forces of about 10-ton exerted on the pole piece 19.

Thereafter, the four column yokes 14a–14d are attached to the four corners of the plate yoke 10 as shown in FIG. 1. On the other hand, the other pole piece 21 (see FIG. 2) is positioned on permanent magnet 17 in the same manner as mentioned above while the magnet 17 faces upward. Subsequently, the plate yoke 12, which carries the magnet 17 and the pole piece 21 thereon, is upset so that the combined magnet 17 and pole piece 21 face downward. Following this, the plate yoke 12 is pulled upward using a large came and moved above the plate yoke 10 as best shown in FIG. 2. Then, the plate yoke 12 is carefully lowered inch-by-inch. A plurality of rods 20, which are received in corresponding holes 22 provided at the undersurface of the plate yoke 12, are to prevent the yoke plate 12 from undesirably fluctuating due to the strong magnetic field.

Thus, the prior art as mentioned above has encountered the problem that the installation of the pole pieces inevitably necessitates a stout or strong installing apparatus such as a strong crane, with the result that the settings of the pole pieces on the permanent magnets are expensive and time consuming to a considerable extent.

SUMMARY OF THE INVENTION

It is therefore an object of the present invention to provide technology via which the pole pieces can be installed at the predetermined positions of the corresponding magnets without difficulty and at a low cost as compared with the prior art.

In brief, the object is achieved by the techniques wherein an MRI system comprises two permanent magnets provided within a yoke structure such as to face each other for generating magnetic field in the space defined therebetween. The MRI system further comprises two pole pieces respectively provided on opposing surfaces of the permanent magnets. Each of the pole pieces is installed at a predetermined position of the permanent magnet by sliding the pole piece on the permanent magnet in a direction parallel with a main surface of the permanent magnet on which the pole pieces is to be installed.

One aspect of the present invention resides in a method of assembling magnetic circuitry for an MRI (magnetic resonance imaging) system, the MRI system comprising two permanent magnets provided within a yoke such as to face each other for generating a magnetic field in a space defined therebetween, and two pole pieces respectively provided on opposing surfaces of said permanent magnets, said method comprising the step of: installing one of the pole pieces at a predetermined position of the corresponding permanent magnet by sliding the pole place on said corresponding permanent magnet in a direction parallel with a main surface of said corresponding permanent magnet on which said one of the pole pieces is to be installed.

Another aspect of the present invention resides in a method of assembling magnetic circuitry for an MRI (magnetic resonance imaging) system, the MRI system comprising two permanent magnets provided within a yoke such as to face each other for generating magnetic field in a space defined therebetween, and two pole pieces respectively provided on opposing surfaces of the permanent magnets, the method comprising the steps of: installing one of the pole pieces at a predetermined position of the corresponding permanent magnet by sliding the one of the pole pieces on the corresponding permanent magnet in a direction parallel with a main surface of the corresponding permanent magnet on which the one of the pole pieces is to be installed; and installing the other pole piece at a predetermined position of the other permanent magnet by sliding the other pole piece on the permanent magnet in a direction parallel with a main surface of the permanent magnet on which the pole piece is to be installed.

BRIEF DESCRIPTION OF THE DRAWINGS

The features and advantages of the present invention will become more clearly appreciated from the following description taken in conjunction with the accompanying drawings in which like elements or portions are denoted by like reference numerals and in which:

FIG. 4 is a diagram showing a manner of incorporating one of two pole pieces into the magnetic field generator of FIG. 3;

FIG. 5 is a sketch schematically showing part of a structure used for incorporating a pole piece into the magnetic field generator of FIG. 3; and FIG. 6 is a diagram showing a manner of incorporating the other pole piece into the magnetic field generator of FIG. 3.

DETAILED DESCRIPTION OF THE PREFERRED EMBODIMENTS

A preferred embodiment of the present invention will be described with reference to FIGS. 3 to 6.

Figure 1:
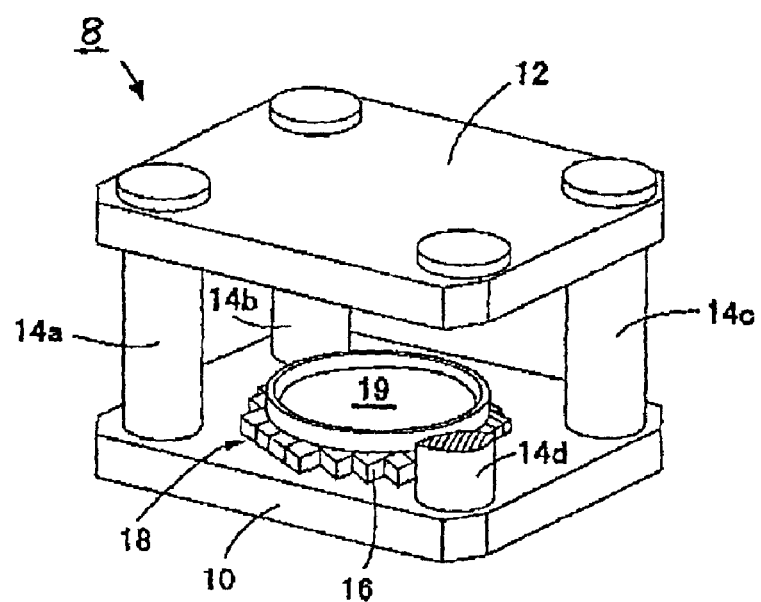
FIG. 1 is a diagram showing a conventional magnetic field generator, having been described in the opening paragraphs of the instant disclosure.
Figure 2:
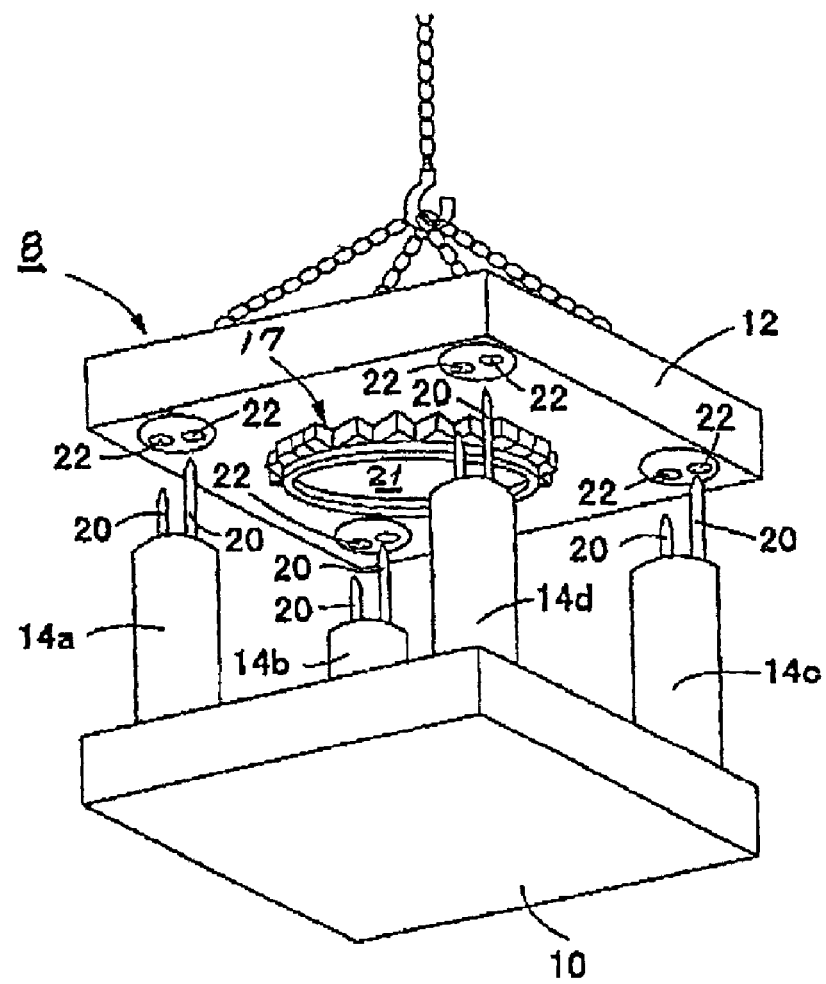
FIG. 2 is a diagram showing a manner of constructing the magnetic field generator of FIG. 1.
Figure 3:
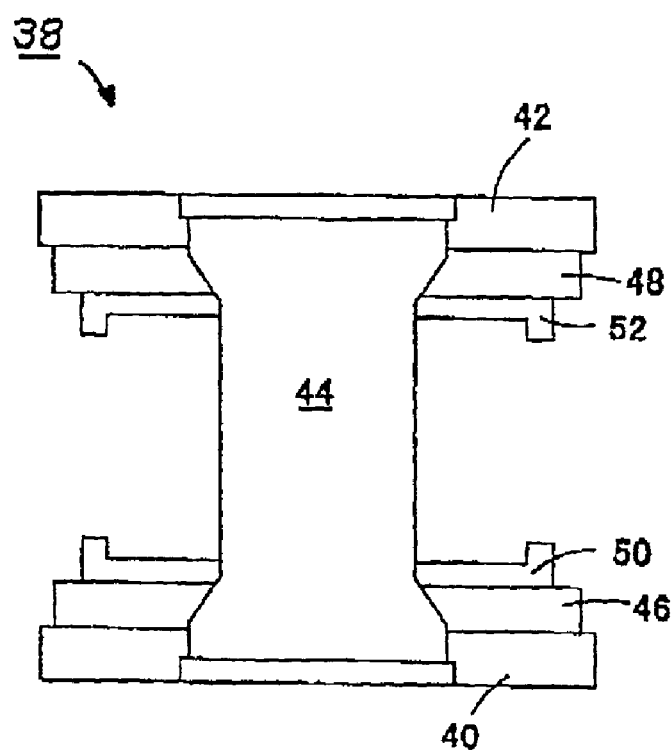
FIG. 3 is a diagram showing a magnetic field generator with which a preferred embodiment of the present invention will be described.

FIG. 3 is a schematic side view of a magnetic field generator 38 to which the present invention is applicable. As shown, the magnetic field generator 38 comprises two plate yokes 40 and 42 supported in parallel by way of two pillar or column yokes (only one is shown and denoted by 44). The generator 38 further comprises two permanent magnets 46 and 48, which carry respectively two pole pieces 50 and 52 on opposite surfaces thereof as in the prior art referred to in the opening paragraphs. As mentioned above, each of the magnets 46 and 48 is fabricated using a plurality of magnetized rectangular or cubic blocks. Each of the magnets is typically an Nd—Fe—B, Sm—Co, or Sm—N—Fe type magnet by way of example. Further, each of the pole pieces 50 and 52 comprises a soft iron substrate on which laminated silica-steel boards are provided, or made of soft ion. Comparing the two magnetic field generators 10 and 38 respectively shown in FIGS. 1 and 3, the generator 38 is provided with two pillar yokes. However, this difference in structure has no meaning, and the present invention can also be applied to the generator 10 of FIG. 1.

The embodiment of the present invention will be described in detail. It is assumed that the permanent magnets 48 and 48 have already been installed on the plate yokes 40 and 42, respectively.

FIG. 4 is a diagram schematically showing how to install the pole piece 52 under the magnet 48 (viz., at a predetermined position defined on the lower surface of the magnet 48) using an assembling apparatus (denoted by 60). Although not shown in FIG. 4, the assembling apparatus 60 is strongly held by a suitable supporter that is typically rested on the floor on which the plate yoke 40 is placed. As an alternative, the supporter might be settled within the yoke structure. The assembling apparatus 60 generally comprises a hollow rectangular guide case 62 which is roughly exemplified in FIG. 5, a screwed rod 64, and a cap or lid 66 through which the rod 64 rotatably advances toward the magnet 48. The guide case 62 is preferably made of nonmagnetic material such as aluminum, and has upper and lower plates 64a–64b and side plates 64c and 64d (FIG. 5) for defining the path along which the pole piece 52 is inserted and advanced. Although it is not shown in FIGS. 4 and 5 how to attach or fasten the cap 66 to the end of the guide case 62, the cap 66 can detachably be attached to the end of the guide case 62 using known technology, and as such, the detail thereof is omitted for brevity.

When the apparatus 60 is set to a predetermined position as illustrated in FIG. 4, the inner surface of the upper side 64a is aligned with the lower major surface of the magnet 48. When starting the installation of the pole piece 52, the rod 64 is removed together with the cap 66. Subsequently, the pole piece 52 is inserted into the guide case 62 as shown in FIG. 5, and the cop 66 is attached after which the rod 64 is inserted into a screwed hole provided in the cap 66. In the above, it is preferable to apply suitable lubricant such as grease to the upper surface of the pole piece 62 and also to the lower surface of the magnet 48 in order to reduce the friction therebetween. Thereafter, the pole piece 52 is advanced toward the magnet 48 by rotating the screw rod 84 as schematically shown in FIG. 4, until being positioned under the center portion of the lower surface of the magnet 48.

As mentioned above, the magnetic attracting forces between the magnet 48 and the pole piece 52 reaches as large as about 10-ton. However, according to the experiment conducted by the inventor, the maximum force required to push the pole piece 52 until setting the same on the predetermined position under the magnet 48 was as small as about 2-ton. More specifically, the experiment was implemented with the following conditions. That is, the frame structure such as shown in FIG. 3 has 1.5 meters in width, 2 meters in depth, and 1.4 meters in height. The plate yokes 40 and 42 were supported using two pillars as shown in FIG. 3.

Further, two Nd—Fe—B type magnets 46 and 48 are provided, between which there exists magnetic field strength of about 0.2-Tesla. The pole piece 52 was disk-shaped and has a diameter of 1 meter, and 100 mm in height including the circumferential protrusion. Still further, a normal type machine grease was applied to the top surface of the pole piece 52 and the lower surface of the magnet 48.

After the pole piece 52 has been installed onto the lower surface of the magnet 48, the other pole piece 50 is then installed onto the magnet 46 as shown in FIG. 6. In FIG. 6, the members or potions corresponding to those described in FIG. 4 are denoted by like numerals plus primes. It is readily understood from the foregoing that the process of installing the lower pole piece 50 is substantially identical to that discussed above, and accordingly, further description thereof is deemed redundant, and as such, will be omitted for brevity.

It is to be noted that the order of installing the pole pieces 52 and 60 is optional and in no way limited to that described above. In the above, the screw rod 64 is used to push the pole pieces 50 and 52. However, it is within the scope of the present invention to employ other known suitable pushing apparatus such as using a piston and cylinder. Still further, it is possible to install both the pole pieces 50 and 52 simultaneously by devising the supporters for supporting both the assembling apparatuses 60 and 60'.

The foregoing descriptions show only one preferred embodiment. However, other various modifications are apparent to those skilled in the art without departing from the scope of the present invention which is only limited by the appended claims. Therefore, the embodiment described are only illustrated, not restrictive.

What is claimed is:

1. A method of assembling magnetic circuitry for an MRI (magnetic resonance imaging) system, the MRI system comprising two permanent magnets provided within a yoke such as to face each other for generating a magnetic field in a space defined therebetween, and two pole pieces respectively provided on opposing surfaces of said permanent magnets, said method comprising the steps of:

assembling the two permanent magnets and the yoke; and installing one of the pole pieces at a predetermined position of the corresponding permanent magnet by sliding the pole piece on said corresponding permanent magnet in contact with a main surface of said corresponding permanent magnet on which said one of the pole pieces is to be installed.

2. The method as claimed in claim 1, wherein lubricant oil is previously applied to portions where the pole piece is to contact the permanent magnet.

3. A method of assembling magnetic circuitry for an MRI (magnetic resonance imaging) system, the MRI system comprising two permanent magnets provided within a yoke such as to face each other for generating magnetic field in a space defined therebetween, and two pole pieces respectively provided on opposing surfaces of said permanent magnets, said method comprising the steps of:

assembling the two permanent magnets and the yoke;

installing one of the pole pieces at a predetermined position of the corresponding permanent magnet by sliding said one of the pole pieces on said corresponding permanent magnet in contact with the main surface of said corresponding permanent magnet on which said one of the pole pieces is to be installed; and installing the other pole piece at a predetermined position of the other permanent magnet by sliding said other pole piece on the permanent magnet in contact with a main surface of the permanent magnet on which the other pole piece is to be installed.

4. The method as claimed in claim 3, wherein lubricant oil is previously applied to portions where each of the pole pieces is to contact the permanent magnet.

* * * * *